United States Patent
Chen et al.

(10) Patent No.: US 8,247,981 B2
(45) Date of Patent: Aug. 21, 2012

(54) INTEGRATED CIRCUIT AND RELATED METHOD FOR DETERMINING OPERATION MODES

(75) Inventors: Ren-Yi Chen, Hsin-Chu (TW); Yi-Lun Shen, Hsin-Chu (TW); Yi-Shan Chu, Hsin-Chu (TW)

(73) Assignee: Leadtrend Technology Corp., Science-Based Industrial Park, Hsin-Chu (TW)

( * ) Notice: Subject to any disclaimer, the term of this patent is extended or adjusted under 35 U.S.C. 154(b) by 414 days.

(21) Appl. No.: 12/536,473

(22) Filed: Aug. 5, 2009

(65) Prior Publication Data

US 2011/0032024 A1 Feb. 10, 2011

(51) Int. Cl.
  *H05B 37/00* (2006.01)
  *H05B 37/02* (2006.01)
(52) U.S. Cl. .................................. 315/200 R; 315/291
(58) Field of Classification Search ............. 315/200 R, 315/291, 307, 312; 323/282
  See application file for complete search history.

(56) References Cited

U.S. PATENT DOCUMENTS

| 7,557,519 B2* | 7/2009 | Kranz ............... 315/291 |
| 7,898,187 B1* | 3/2011 | Mei et al. ........... 315/247 |
| 2009/0284180 A1* | 11/2009 | Shen et al. .......... 315/307 |

* cited by examiner

*Primary Examiner* — Daniel D Chang
(74) *Attorney, Agent, or Firm* — Winston Hsu; Scott Margo

(57) ABSTRACT

An integrated circuit and a related method for determining an operation mode are disclosed. The exemplified integrated circuit includes a controller, a multi-function pin, and a mode determination circuit. The controller controls a power switch and is being set to operate in one of the operation modes including a first operation mode and a second operation mode. The multi-function pin is connected to an external resistor. The mode determination circuit detects a signal from the multi-function pin. The signal represents the resistance of the external resistor. If the resistance is within a first range, the controller is operated in the first operation mode. If the resistance is within a second range, the controller is operated in the second operation mode.

8 Claims, 5 Drawing Sheets

INTEGRATED CIRCUIT AND RELATED METHOD FOR DETERMINING OPERATION MODES

BACKGROUND OF THE INVENTION

1. Field of the Invention

The present invention relates to a method for determining operation modes and a related circuit, and more particularly, to a method for determining operation modes and a related circuit used in a power supply.

2. Description of the Prior Art

In order to decrease the package size, the pin count of the integrated circuit (IC) is also preferably smaller. The concept of a multi-function pin is thus developed. The power management IC of the power supply also needs the multi-function pin to reduce the packaging cost.

For instance, a light emitting diode (LED) driver IC, HV9910B, manufactured and sold by a company, Supertex, located in California, U.S.A., has a multi-function pin RT. FIGS. 1 and 2 show two light emitting diode (LED) driver systems, of which integrated circuit $IC_1$ is HV9910B, suggested in the datasheet of HV9910B. The detailed system circuit operation of FIGS. 1 and 2 can be found in the datasheet of HV9910B. Briefly speaking, as power switch $Q_1$ is turned on, inductor L starts to store the energy and current $I_{LED}$ flows from the power source $V_{IN}$ through LEDs $LED_1$ to $LED_N$, inductor L, power switch $Q_1$, and resistor $R_{CS}$. If current $I_{LED}$ is as large as a preset value, then power switch $Q_1$ is turned off, inductor L starts to release the stored energy and current $I_{LED}$ flows through a loop composed of LEDs $LED_1$ to $LED_N$, inductor L, and diode D. As for the turned-off power switch $Q_1$, it is again turned on depending on the operation mode. FIG. 1 shows the system operated in the pulse width modulation (PWM) mode; FIG. 2 shows the system operated in the constant off-time mode.

The difference between FIG. 1 and FIG. 2 is only the way for connecting resistor $R_T$. If integrated circuit $IC_1$ determines that one end of resistor $R_T$ is connected to the ground (GND) through multi-function pin RT, as shown in FIG. 1, integrated circuit $IC_1$ would make the entire LED driver system operate in the PWM mode, such that switching frequency $f_{PWM}$ would be about a fixed value. If integrated circuit $IC_1$ determines that the end of resistor $R_T$ is connected to pin GATE to receive a high voltage (e.g. 12V) therefrom, as shown in FIG. 2, integrated circuit $IC_1$ would make the entire LED driver system operate in the constant off-time mode, such that off-time $T_{OFF}$ is about a fixed value. The resistance of resistor $R_T$ is also used to determine switching frequency $f_{PWM}$ in the PWM mode or off-time $T_{OFF}$ in the constant off-time mode.

In other words, multi-function pin RT is used not only to determine the operation mode of integrated circuit $IC_1$ but also to determine the off-time of power switch $Q_1$.

However, such multi-function pin RT design may cause the negative effects to the internal circuit design of integrated circuit $IC_1$.

These and other objectives of the present invention will no doubt become obvious to those of ordinary skill in the art after reading the following detailed description of the preferred embodiment that is illustrated in the various figures and drawings.

DETAILED DESCRIPTION

For easily understanding the objectives, features, and advantages of the present invention, a detailed description with preferred embodiments accompanying figures is described as follows.

Figure 2:
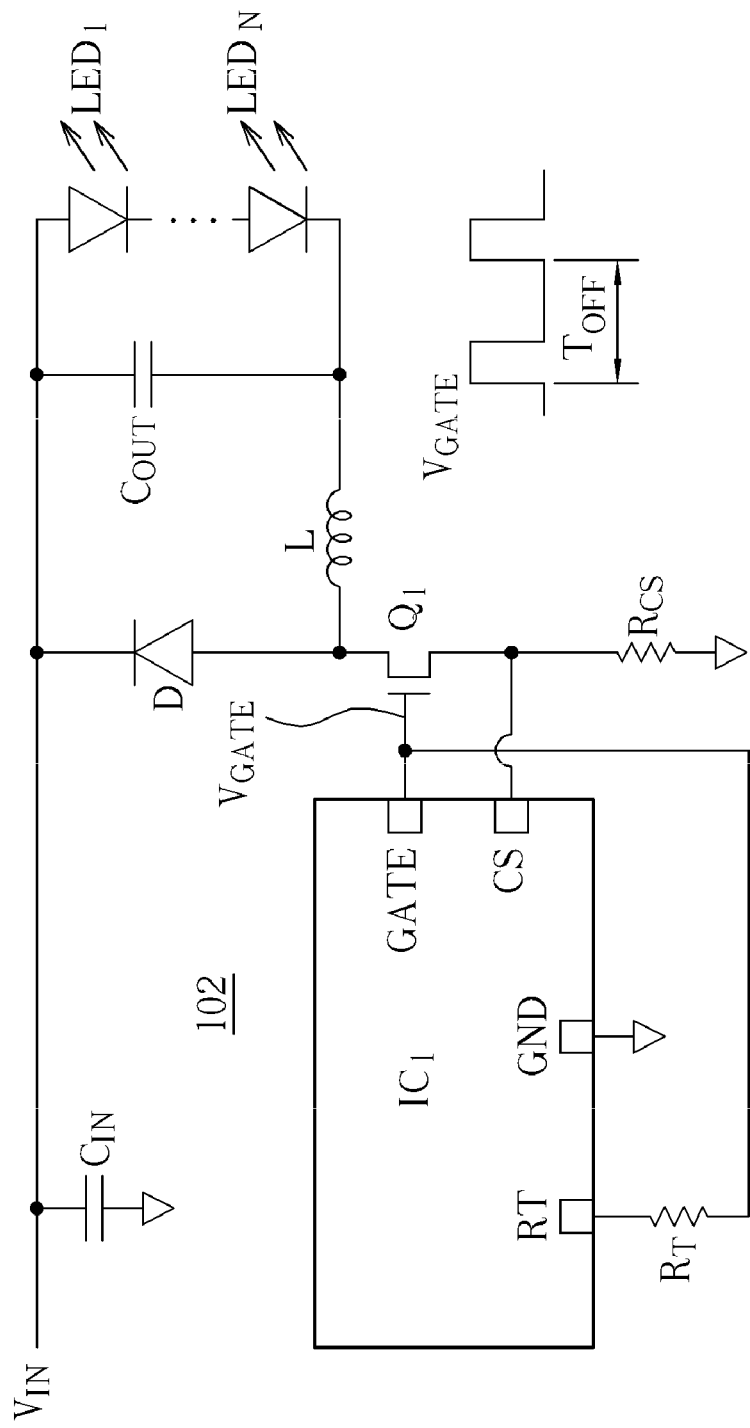
Figure 3:
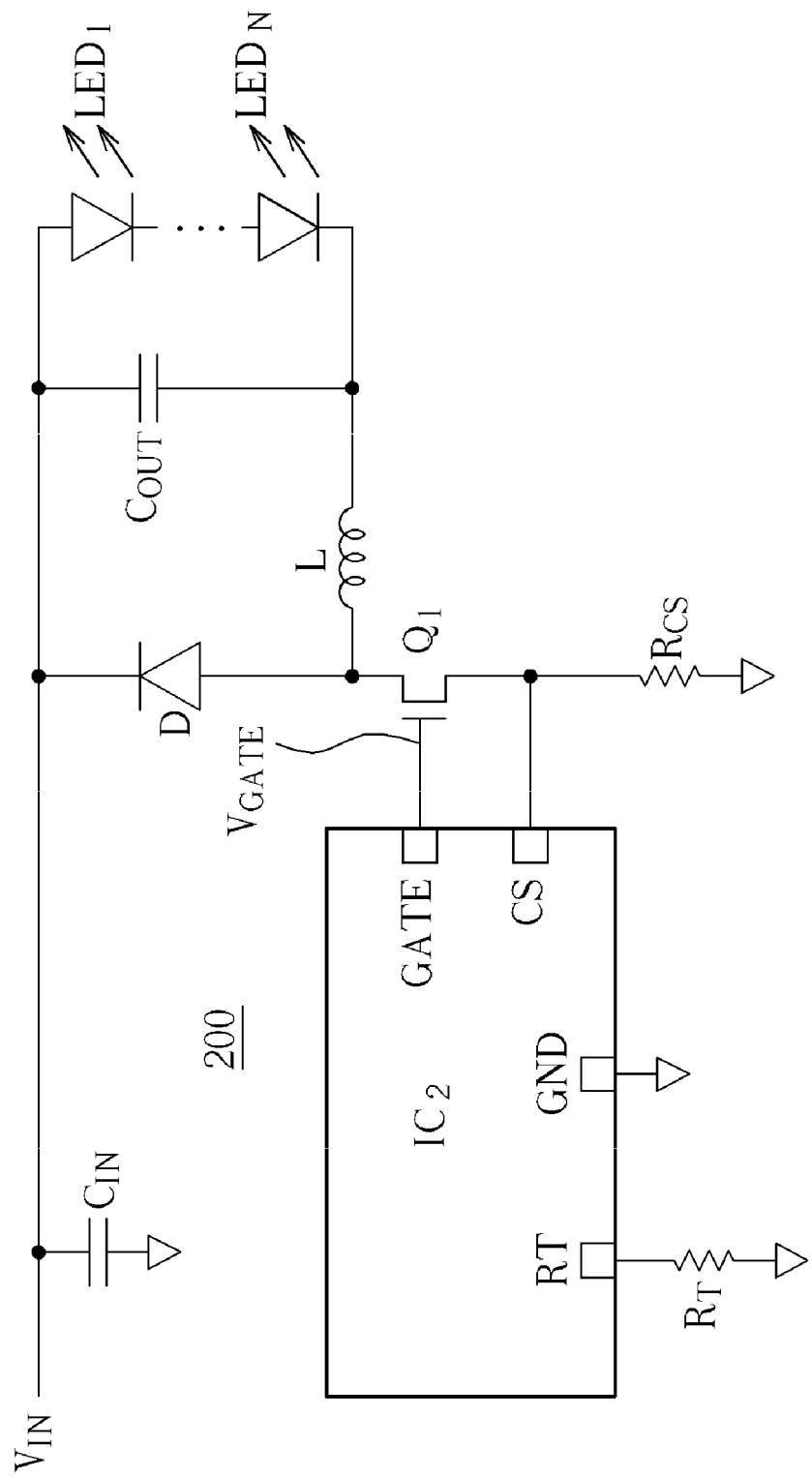
FIG. 3 is an LED driver system according to a preferred embodiment of the present invention.

FIG. 3 is an LED driver system 200 according to an embodiment of the present invention. Different to integrated circuit $IC_1$ in FIGS. 1 and 2, integrated circuit $IC_2$ in FIG. 3 is determined to operate in the PWM mode or the constant off-time mode according to the resistance of resistor $R_T$, so as to control power switch $Q_1$ for converting the power and then driving LEDs $LED_1$ to $LED_N$. Since the principle and the operation between power switch $Q_1$, current detecting resistor $R_{CS}$, inductor L, capacitors $C_{IN}$ and $C_{OUT}$, diode D, and LEDs $LED_1$ to $LED_N$ in FIG. 3 are identical or similar to the corresponding elements in FIG. 1, the detailed description thereof will be omitted.

With reference to FIG. 3, if the resistance of resistor $R_T$ is larger than 8.5 KΩ, integrated circuit $IC_2$ operates in the constant off-time mode. Thus, off-time $T_{OFF}$, i.e. the period from power switch $Q_1$ turned off to it turned on again, is an approximate fixed time that is determined by the resistance of resistor $R_T$.

As shown in FIG. 3, if the resistance of resistor $R_T$ is smaller than 8.5 KΩ, integrated circuit $IC_2$ operates in the PWM mode. Thus, switching frequency $f_{PWM}$, i.e. the reciprocal of the time interval for one turn-on time and a consecutive turn-off time of power switch $Q_1$, is an approximate fixed frequency that is determined by the resistance of resistor $R_T$.

Therefore, multi-function pin RT is used to determine not only the operation mode of integrated circuit $IC_2$ but also the switching time of power switch $Q_1$.

Figure 1:
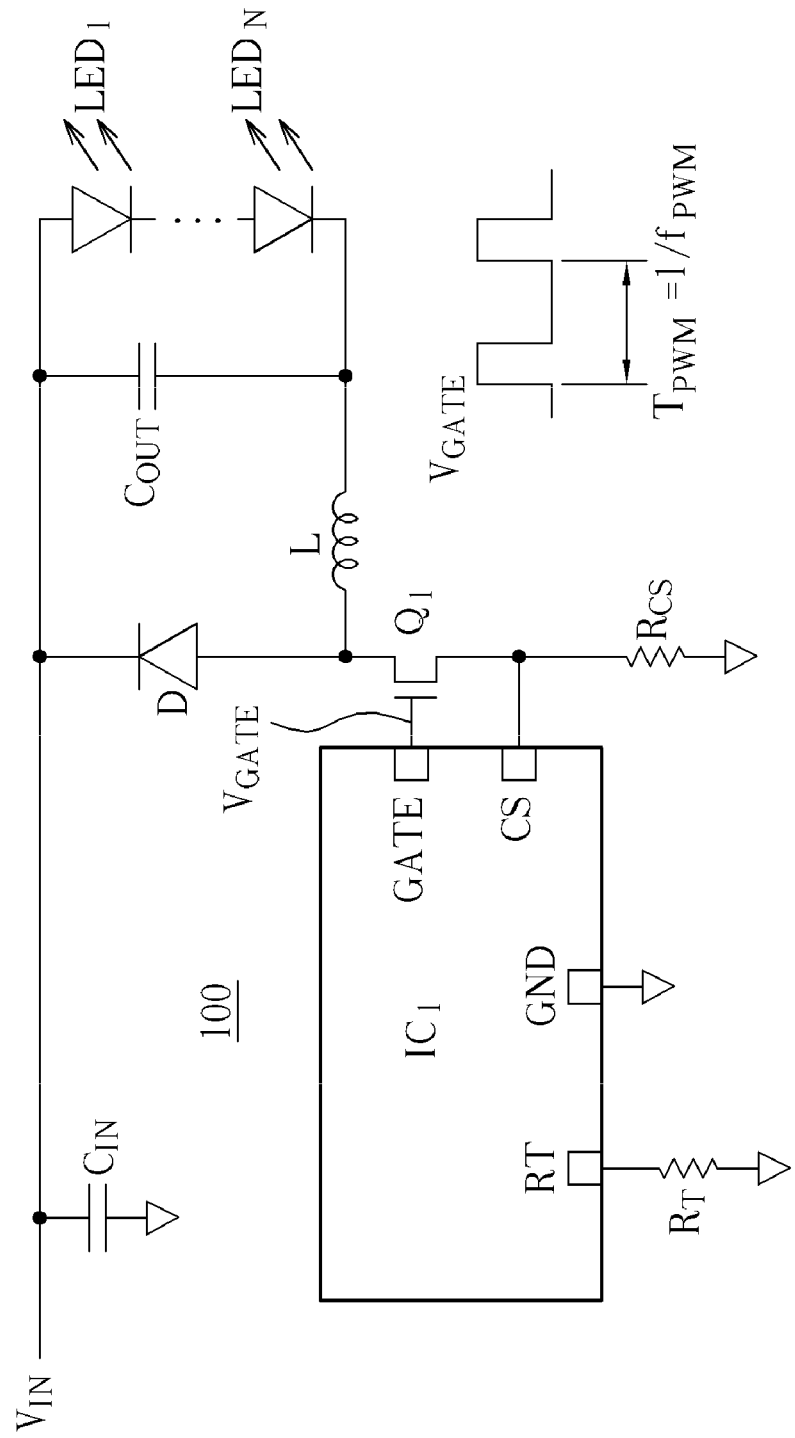
FIGS. 1 and 2 are two conventional light emitting diode (LED) drivers.

Compared to multi-function pin RT of integrated circuit $IC_2$ in FIG. 3, multi-function pin RT of integrated circuit $IC_1$ in FIGS. 1 and 2 will have two problems as follows.

1. A high voltage circuit is needed for the input/output (I/O) circuit of multi-function pin RT of integrated circuit $IC_1$. Because pin GATE is used to turn on/off power switch $Q_1$, the output voltage from pin GATE is usually a high voltage, for example, 12 volts. Since multi-function pin RT of integrated circuit $IC_1$ in FIG. 2 is connected to pin GATE, the I/O circuit of pin RT has to use high voltage circuit for tolerating the high voltage (12V) signal from pin GATE.

2. The I/O circuit of multi-function pin RT of integrated circuit $IC_1$ may be interfered by the high frequency switching signal. Pin GATE of integrated circuit $IC_1$ outputs a high frequency signal to turn on/off power switch $Q_1$. When integrated circuit $IC_1$ operates in the constant off-time mode in FIG. 2, such high frequency switching signal enters multi-function pin RT through resistor $R_T$, and further affects a constant off-time control circuit connected to multi-function pin RT. Hence integrated circuit $IC_1$ needs extra protection to prevent the I/O circuit of multi-function pin RT from being interfered by the high frequency switching signal outputted from pin GATE.

Multi-function pin RT of integrated circuit $IC_2$ in FIG. 3 does not have the problems as mentioned above. A low voltage, for example, 5 volts, circuit may be used for the I/O circuit of multi-function pin RT of integrated circuit $IC_2$. This is because multi-function pin RT of integrated circuit $IC_2$ is always coupled to the ground (GND) and does not receive the high voltage (12V) signal, whether integrated circuit $IC_2$ operates in the constant off-time mode or the PWM mode. It is well-known that low voltage (e.g. 5V) circuit generally costs a smaller chip area than high voltage (e.g. 12V) circuit, and thus it is more likely to reduce the cost if the low voltage circuit is put to use. Similarly, as shown in FIG. 3, since multi-function pin RT of integrated circuit $IC_2$ and pin GATE are separated whether integrated circuit $IC_2$ operates in the constant off-time mode or the PWM mode, multi-function pin RT of integrated circuit $IC_2$ is not interfered by the high frequency signal outputted from pin GATE. This is why an extra cost for the protection of the high frequency interference is not needed for integrated circuit $IC_2$.

Figure 4:
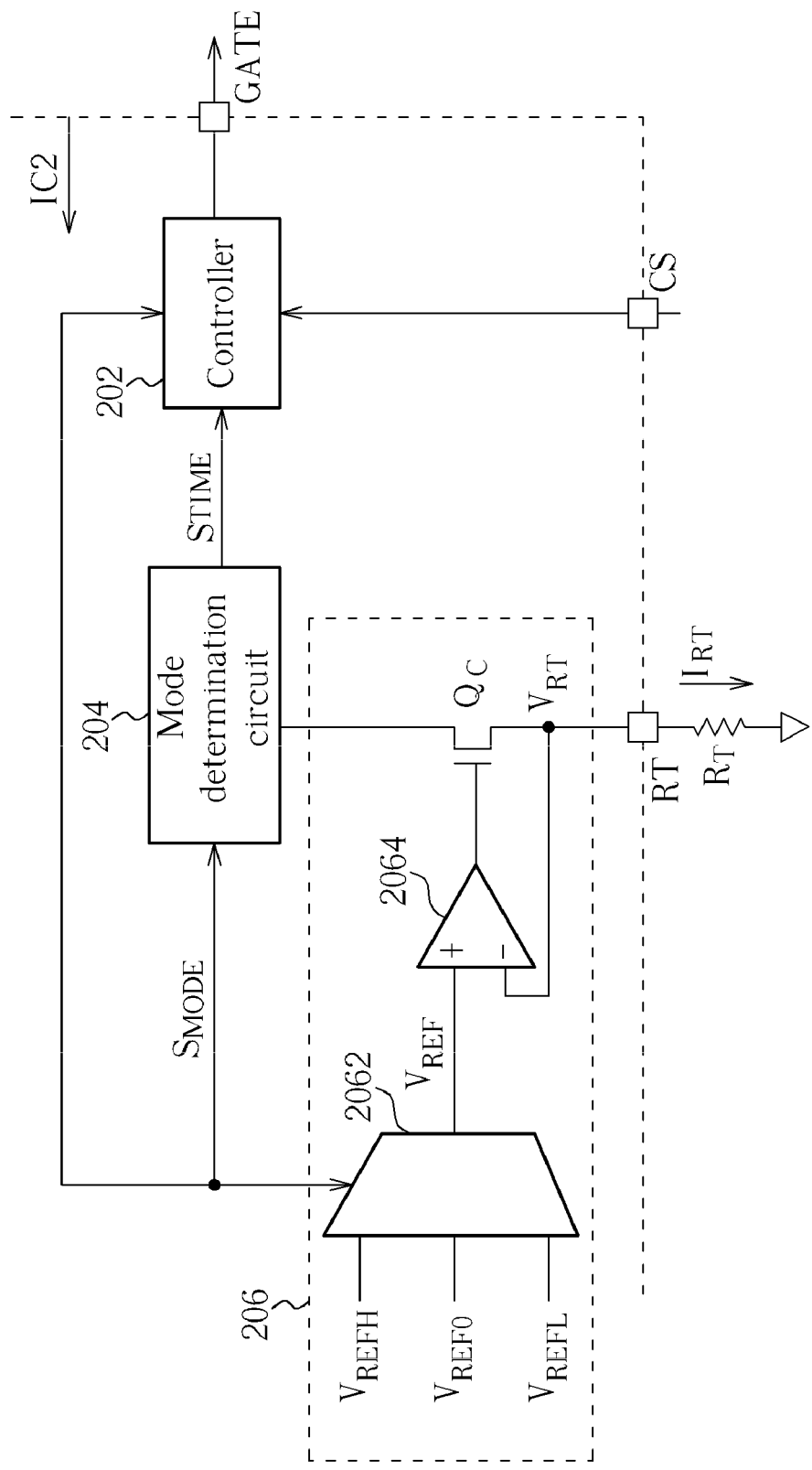
FIG. 4 is a schematic view of a part of a circuit in FIG. 3.

FIG. 4 is a schematic view of a part of the circuit in FIG. 3. With reference to FIG. 4, integrated circuit $IC_2$ comprises controller 202, mode determination circuit 204, and voltage setting circuit 206. Controller 202 controls switching of power switch $Q_1$ in FIG. 3 through pin GATE. Mode determination circuit 204 detects the current flowing through multi-function pin RT and thus equally detects the resistance of resistor $R_T$ as well. According to the detected resistance, Mode determination circuit 204 sends out the mode signal $S_{MODE}$ to set controller 202 operating in one of the operation modes. For example, if the resistance of resistor $R_T$ is larger than 8.5 KΩ, mode determination circuit 204 sets controller 202 to operate in the constant off-time mode and sends out time signal $S_{TIME}$ according to the detected resistance of resistor $R_T$ to determine off-time $T_{OFF}$. When the resistance of resistor $R_T$ is smaller than 8.5 KΩ, mode determination circuit 204 sets controller 202 to operate in the PWM mode and sends out time signal $S_{TIME}$ according to the detected resistance of resistor $R_T$ to determine switching frequency $f_{PWM}$.

Voltage setting circuit 206 sets voltage $V_{RT}$ of multi-function pin RT according to mode signal $S_{MODE}$. As shown in FIG. 4, voltage setting circuit 206 comprises a multiplexer 2062 that has three input terminals receiving the fixed voltages $V_{REFH}$, $V_{REF0}$, and $V_{REFL}$, respectively. In this embodiment, $V_{REFH}$, $V_{REF0}$, and $V_{REFL}$ are 1V, 0.6 V, and 0.2V, respectively. According to mode signal $S_{MODE}$, multiplexer 2062 selects one of fixed voltages $V_{REFH}$, $V_{REF0}$, and $V_{REFL}$ as a reference voltage $V_{REF}$ to output to comparator 2064. The circuit connection between comparator 2064 and switch $Q_C$ can maintain voltage $V_{RT}$ of multi-function pin RT about equal to the reference voltage $V_{REF}$. Besides, current $I_{RT}$ passing through resistor $R_T$ will also flow through switch $Q_C$ and be detected by mode determination circuit 204.

Figure 5:
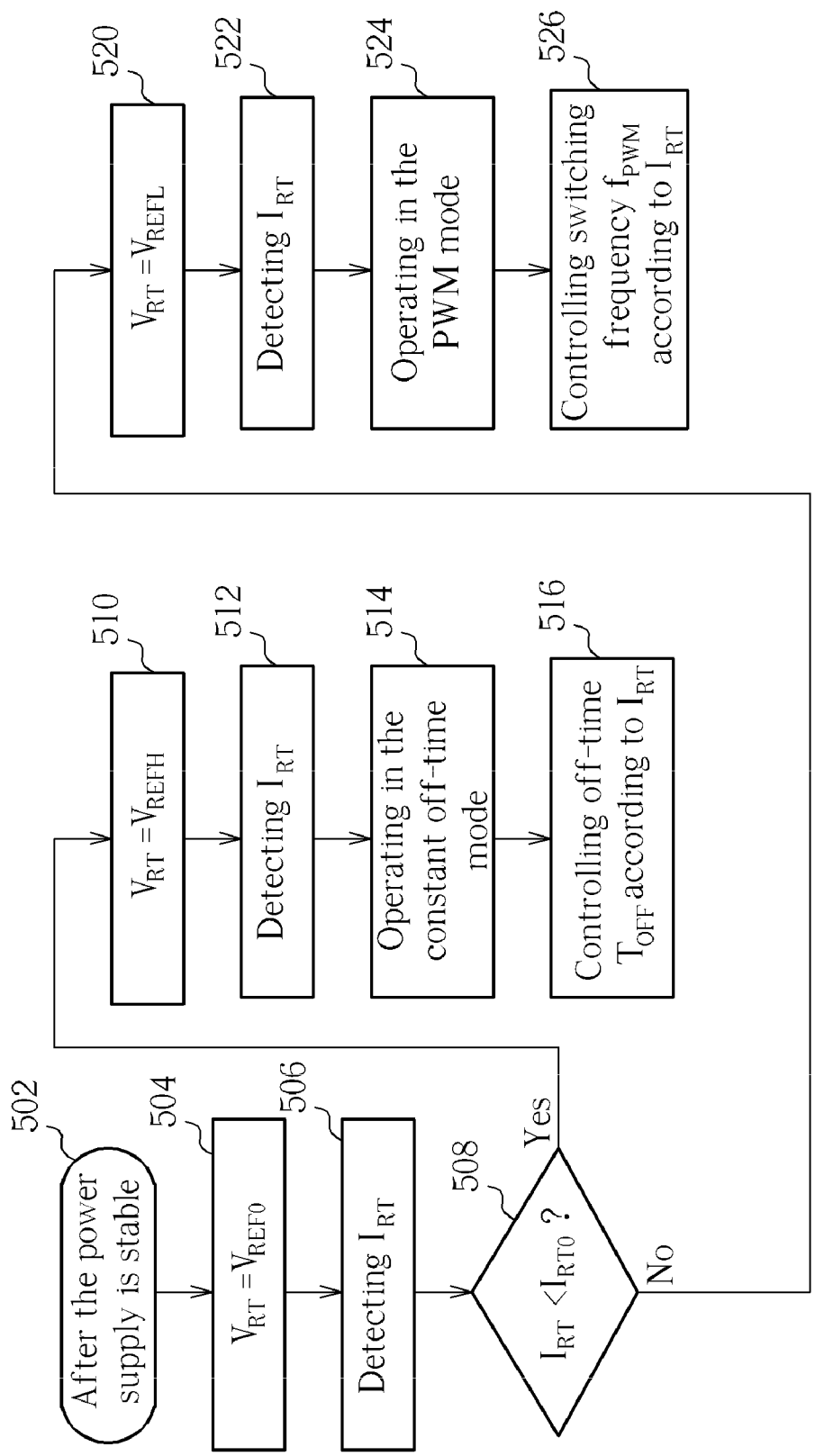
FIG. 5 is a flow chart illustrating a method for operating the circuit in FIG. 4.

FIG. 5 is a flow chart illustrating a method of an embodiment for operating the circuit in FIG. 4. With reference to FIGS. 4 and 5, step 502 shows that when integrated circuit $IC_2$ in FIG. 4 is just connected to the power supply, the power supply will be stable after a settle time, and after fixed voltages $V_{REFH}$, $V_{REF0}$, and $V_{REFL}$ are steadily generated, other steps will then be performed. In step 504, mode determination circuit 204 makes multiplexer 2062 select to output fixed voltage $V_{REF0}$ according to mode signal $S_{MODE}$, so that voltage $V_{RT}$ of multi-function pin RT is approximately equal to fixed voltage $V_{REF0}$. In step 506, mode determination circuit 204 detects current $I_{RT}$ flowing through multi-function pin RT. In step 508, current $I_{RT}$ is compared to determine whether it is smaller than a predetermined current value $I_{RT0}$. With reference to FIG. 4, fixed voltage $V_{REF0}$ is 0.6V and the predetermined value of current $I_{RT0}$ is 70 µA. Thus, in steps 506 and 508, mode determination circuit 204 equivalently determines whether the resistance of resistor $R_T$ is larger than 8.5 KΩ (~0.6V/70 uA). If the resistance of resistor $R_T$ is determined to be larger than 8.5 KΩ, mode determination circuit 204 determines integrated circuit $IC_2$ to operate in the off-time mode and then step 510 is performed; if the resistance of resistor $R_T$ is determined to be smaller than 8.5 KΩ, mode determination circuit 204 determines integrated circuit $IC_2$ to operate in the PWM mode and then step 520 is performed.

Similar to step 504, in step 510, mode determination circuit 204 changes voltage $V_{RT}$ of multi-function pin RT to fixed voltage $V_{REFH}$ through voltage setting circuit 206. As shown in FIG. 4, fixed voltage $V_{REFH}$ is 1V. In step 512, mode determination circuit 204 detects current $I_{RT}$ flowing through multi-function pin RT. In step 514, mode determination circuit 204 indicates controller 202 to operate in the constant off-time mode. Moreover, mode determination circuit 204, as shown in step 516, controls off-time $T_{OFF}$ in the constant off-time mode according to current $I_{RT}$. For example, if current $I_{RT}$ is about 93.747 µA, which means the resistance of resistor $R_T$ is about 10.667 KΩ (~1V/93.747 uA), off-time $T_{OFF}$ is about 0.5 micro-seconds; if current $I_{RT}$ is about 0.93747 µA, which means the resistance of resistor $R_T$ is about 1.06667 MΩ (~1V/93.747 uA), off-time $T_{OFF}$ is about 50 micro-seconds.

In step 520, mode determination circuit 204 changes voltage $V_{RT}$ of multi-function pin RT to fixed voltage $V_{REFL}$ through voltage setting circuit 206. With reference to FIG. 4, fixed voltage $V_{REFL}$ is 0.2V. In step 522, mode determination circuit 204 then detects current $I_{RT}$ flowing through multi-function pin RT. In step 524, mode determination circuit 204 indicates controller 202 to operate in the PWM mode. Similarly, mode determination circuit 204 controls switching frequency $f_{PWM}$ in the PWM mode in accordance with the current $I_{RT}$. For example, integrated circuit $IC_2$ may be designed that if the current $I_{RT}$ is about 30 µA, which means the resistance of resistor $R_T$ is about 6.667 KΩ (~0.2V/30 uA), switching frequency $f_{PWM}$ of integrated circuit $IC_2$ is about 30 KHz; if current $I_{RT}$ is about 200 µA, which means the resistance of resistor $R_T$ is about 1 KΩ (~0.2V/200 uA), switching frequency $f_{PWM}$ of integrated circuit $IC_2$ is about 200 KHz.

With reference to the above embodiment, 8.5 KΩ is a watershed. Resistor $R_T$ with the resistance larger than 8.5 KΩ may make integrated circuit $IC_2$ operate in the constant off-time mode, and this resistance may be as large as 1.0667 MΩ. Resistor $R_T$ with the resistance smaller than 8.5 KΩ may make integrated circuit $IC_2$ operate in the PWM mode, and this resistance may be as small as 1 KΩ. To sum up, in this embodiment, the usable resistance range of resistor $R_T$ is from 1 KΩ to 1.0667 MΩ and the largest resistance is about 1000 (i.e. 10 to the power of three) times to the smallest resistance.

According to the above embodiments, if the operation mode changes, voltage $V_{RT}$ of multi-function pin RT will change; thereby the problem of serious variation in current $I_{RT}$ is solved. Alternatively, if voltage $V_{RT}$ of multi-function pin RT stays constant and does not change with the operation modes, it would be difficult to design integrated circuit $IC_2$ because integrated circuit $IC_2$ needs to identify current $I_{RT}$ with variation up to $10^3$ times. From the above embodiment, if voltage $V_{RT}$ of multi-function pin RT is switched with the operation modes, the variation in current $I_{RT}$ would decrease to $10^2$ times (from 0.93747 µA to 200 µA) and the current detecting ability requirement of integrated circuit $IC_2$ can be relatively relaxed so that it can be designed more easily.

As described above, the above embodiment discloses that the I/O circuit of multi-function pin RT needs only a low voltage circuit and the I/O circuit of the multi-function pin is prevented from being interfered by the high-frequency signals, and the problem of possibly wide variation in current $I_{RT}$

What is claimed is:

1. An integrated circuit, comprising:
 a controller for controlling a power switch, the controller set to operate in one of operation modes, the operation modes comprising a first operation mode and a second operation mode;
 a multi-function pin for connecting an external resistor;
 a mode determination circuit for detecting a signal representing a resistance of the external resistor from the multi-function pin, and thus indicating the controller to operate in a first operation mode if the resistance within a first range or operate in a second operation mode if the resistance within a second range, wherein the operation modes are used for power conversion; and
 a voltage setting circuit for setting voltage of the multi-function pin to approximately a first fixed voltage before the mode determination circuit indicates the controller to operate in the first operation mode or the second operation mode, for setting the voltage of the multi-function pin to approximately a second fixed voltage after the mode determination circuit indicates the controller to operate in the first operation mode, and for setting the voltage of the multi-function pin to approximately a third fixed voltage after the mode determination circuit indicates the controller to operate in the second operation mode, wherein the first fixed voltage is between the second fixed voltage and the third fixed voltage.

2. The integrated circuit of claim 1, wherein the first operation mode is a pulse width modulation (PWM) mode and the second operation mode is a constant off-time mode.

3. The integrated circuit of claim 2, wherein the resistance of the external resistor is used to determine an operation frequency of the PWM mode or an off-time of the constant off-time mode.

4. The integrated circuit of claim 1, wherein the power switch is used in a power conversion system.

5. A method for determining operation modes, comprising:
 providing an integrated circuit having a multi-function pin connected to an external resistor;
 detecting resistance of the external resistor by:
  setting voltage of the multi-function pin to approximately a first fixed voltage and detecting current flowing through the external resistor;
  setting the voltage of the multi-function pin to approximately a second fixed voltage if the resistance is smaller than a first predetermined resistance, wherein the second fixed voltage is smaller than the first fixed voltage; and
  setting the voltage of the multi-function pin to approximately a third fixed voltage if the resistance is larger than a first predetermined resistance, wherein the third fixed voltage is larger than the first fixed voltage;
 performing a power conversion by controlling a power switch in a first operation mode if the resistance is smaller than the first predetermined resistance; and
 performing the power conversion by controlling the power switch in a second operation mode if the resistance is larger than the first predetermined resistance; wherein the second operation mode is different from the first operation mode.

6. The method of claim 5, wherein the first operation mode is a pulse width modulation (PWM) mode and the second operation mode is a constant off-time mode.

7. The method of claim 6, further comprising:
 controlling switching time of the power switch in accordance with the resistance of the external resistor.

8. The method of claim 5, wherein the power switch is used to drive a plurality of light emitting diodes (LED).

* * * * *